(12) United States Patent
Nakamura et al.

(10) Patent No.: US 9,800,815 B2
(45) Date of Patent: Oct. 24, 2017

(54) IMAGE PICKUP APPARATUS AND IMAGE PICKUP SYSTEM USING IMAGE PICKUP APPARATUS

(71) Applicant: CANON KABUSHIKI KAISHA, Tokyo (JP)

(72) Inventors: Kohichi Nakamura, Kawasaki (JP); Tetsuya Itano, Sagamihara (JP); Hiroki Hiyama, Sagamihara (JP); Hiroaki Kameyama, Kawasaki (JP); Kazuhiro Saito, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 148 days.

(21) Appl. No.: 14/954,830

(22) Filed: Nov. 30, 2015

(65) Prior Publication Data

US 2016/0156866 A1 Jun. 2, 2016

(30) Foreign Application Priority Data

Dec. 2, 2014 (JP) ................................. 2014-244334

(51) Int. Cl.
*H04N 5/357* (2011.01)
*H04N 5/378* (2011.01)
*H03M 1/12* (2006.01)
*H03M 1/34* (2006.01)

(52) U.S. Cl.
CPC .......... *H04N 5/378* (2013.01); *H04N 5/3575* (2013.01); *H03M 1/123* (2013.01); *H03M 1/34* (2013.01)

(58) Field of Classification Search
CPC ..... H04N 5/3575; H04N 5/378; H03M 1/123; H03M 1/34
See application file for complete search history.

(56) References Cited

U.S. PATENT DOCUMENTS

| 9,635,299 B2* | 4/2017 | Hijikata | ................. H04N 5/378 |
| 2008/0186388 A1* | 8/2008 | Yamagata | ............. H04N 5/335 348/222.1 |
| 2010/0002120 A1* | 1/2010 | Yoshikawa | .......... H03K 5/2481 348/312 |
| 2014/0124651 A1* | 5/2014 | Nakahara | .................. G01J 1/44 250/208.1 |

FOREIGN PATENT DOCUMENTS

| JP | 2008-193373 A | 8/2008 |
| JP | 2010-016656 A | 1/2010 |

* cited by examiner

*Primary Examiner* — Daniel M Pasiewicz
(74) *Attorney, Agent, or Firm* — Canon USA, Inc., IP Division

(57) ABSTRACT

An image pickup apparatus includes a plurality of pixels arranged in rows and columns, a plurality of comparators, each of the comparators including a switch for controlling an operation, a signal line which is provided commonly to the switches of the plurality of comparators and through which a control signal for controlling the switches of the plurality of comparators is supplied, a control signal generation unit, and a signal line control unit configured to control an electric potential of the signal line to be set as a fixed electric potential.

16 Claims, 13 Drawing Sheets

IMAGE PICKUP APPARATUS AND IMAGE PICKUP SYSTEM USING IMAGE PICKUP APPARATUS

BACKGROUND OF THE INVENTION

Field of the Invention

One disclosed aspect of the embodiments relates to an image pickup apparatus and an image pickup system using the image pickup apparatus.

Description of the Related Art

An image pickup apparatus including an analog-to-digital (AD) converter provided in association with a column of pixels has been proposed. The AD converter is provided with a comparator configured to compare a pixel signal with a reference signal. Japanese Patent Laid-Open No. 2010-016656 discloses a technology for restricting an amplitude of a control signal for controlling a feedback switch to reduce an offset for each comparator including the feedback switch for calibration.

According to Japanese Patent Laid-Open No. 2010-016656, a signal line of the control signal for controlling the feedback switch is also connected to a feedback switch of a comparator on another column. According to the above-described configuration, when an output of the comparator is inverted, an output of the comparator on the other column may be affected in some cases. That is, crosstalk may occur. When this crosstalk occurs, an error may be caused in a result of the comparator on the other column. The error of the result of the comparator is an error of an AD conversion result, and an image quality is decreased. The above-described crosstalk may occur in a case where not only a line for the feedback switch but also a signal line for controlling an operation of the comparator is provided commonly to a plurality of comparators.

SUMMARY OF THE INVENTION

An embodiment has been made in view of the above-described issue and aims at reducing the error that is caused at the time of signal comparison.

An image pickup apparatus according to an aspect of the embodiments includes: a plurality of pixels arranged in rows and columns; a plurality of comparators, each of the comparators being provided in association with at least one column of the plurality of pixels, and each of the comparators including a switch for controlling an operation; a signal line which is provided commonly to the switches of the plurality of comparators and through which a control signal for controlling the switches of the plurality of comparators is supplied; a control signal generation unit configured to supply the control signal to the signal line; and a signal line control unit configured to control an electric potential of the signal line to be set as a fixed electric potential, in which the plurality of comparators are arranged between the control signal generation unit and the signal line control unit.

Further features of the disclosure will become apparent from the following description of exemplary embodiments with reference to the attached drawings.

DESCRIPTION OF THE EMBODIMENTS

First Exemplary Embodiment

The present exemplary embodiment will be described with reference to FIG. 1 to FIG. 9. The same reference symbol is assigned to the same configuration in FIG. 1 to FIG. 9. In the following descriptions, a switch is turned ON when its level is a high level (hereinafter, will be referred to as an H level) and is turned OFF when its level is a low level (hereinafter, will be referred to as an L level). The switch includes, for example, a MOS transistor, a CMOS transistor, and the like. A terminal, one end, and the other end mean not only an electrode but also a node in some cases. In addition, in the following descriptions, a reference symbol VDD denotes an arbitrary power source voltage, and a reference symbol GND denotes a ground electric potential. One disclosed feature of the embodiments may be described as a process which is usually depicted as a timing chart or timing diagram. A timing diagram may illustrate the timing relationships of several entities, such as signals, events, etc. Although a timing diagram may describe the operations as a sequential process, some operations may be performed in parallel or concurrently. In addition, unless specifically stated, the order of the operations or timing instants may be re-arranged. Furthermore, the timing or temporal distances may not be scaled or depict the timing relationships in exact proportions.

Figure 1:
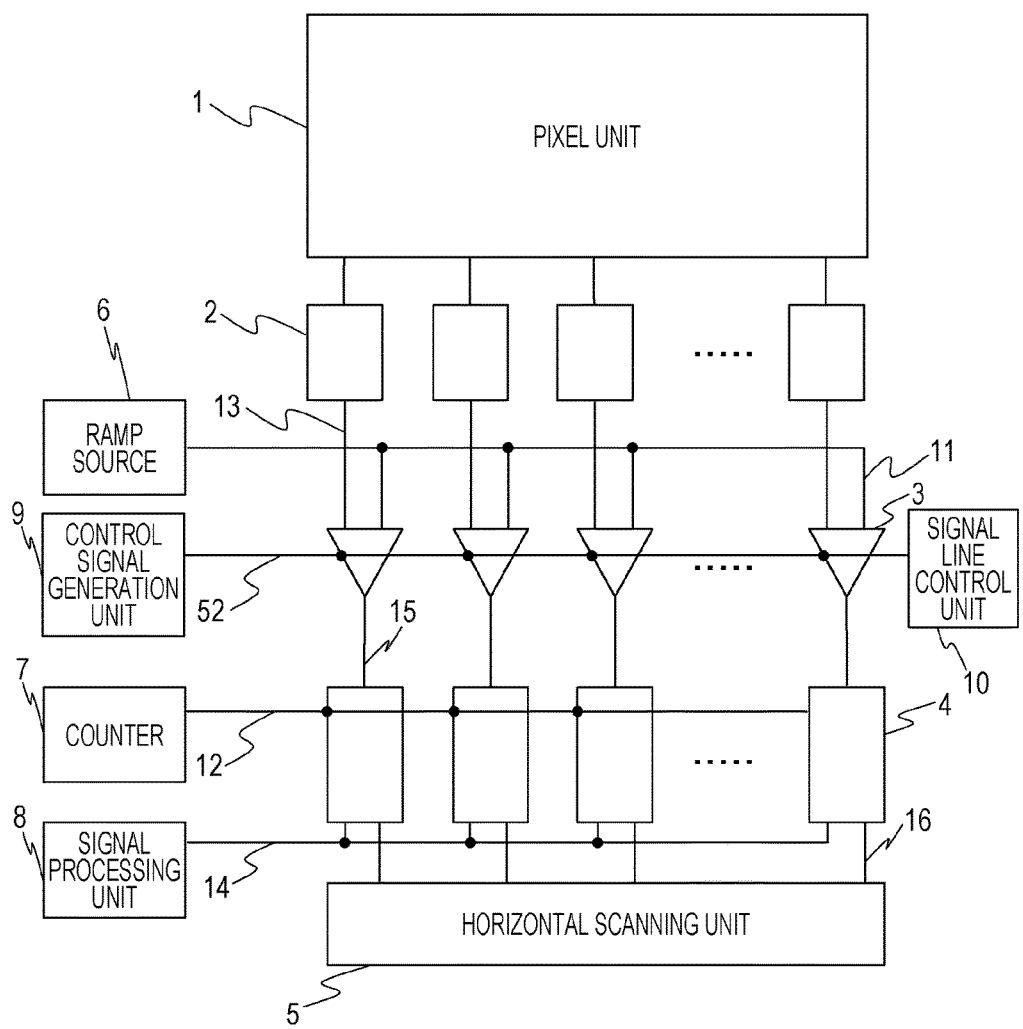
FIG. 1 is a block diagram for describing an image pickup apparatus according to a first exemplary embodiment.

FIG. 1 is a block diagram for describing an image pickup apparatus according to the first exemplary embodiment. The image pickup apparatus includes a pixel unit 1, a plurality of reading unit 2, a plurality of comparators 3, a plurality of storage units 4, a horizontal scanning unit 5, a ramp source 6, a counter 7, a signal processing unit 8, and a control signal generation unit 9. The image pickup apparatus further includes a signal line control unit 10 connected to a signal line 52 to which the control signal generation unit 9 outputs a signal. The signal line control unit 10 will be described below in detail. The image pickup apparatus further includes a function block (not illustrated) such as a vertical scanning unit. The plurality of comparators 3 are arranged between the control signal generation unit 9 and the signal line control unit 10.

A plurality of pixels are arranged in a matrix in the pixel unit 1. The reading unit 2 is arranged in association with a pixel column of the pixel unit 1 and outputs a pixel signal from the pixel unit 1 to a signal line 13. The ramp source 6 supplies a ramp signal to the plurality of comparators 3 via the signal line 11 for the ramp signal. The ramp signal is also referred to as a reference signal. The ramp signal is a signal that monotonically increases or decreases in accordance with time in general but may be, for example, a signal that changes stepwise. The counter 7 supplies a count value to the plurality of storage units 4 via a signal line 12 for count data.

The comparator 3 is arranged in association with the pixel column of the pixel unit 1. The comparator 3 compares the pixel signal with the ramp signal and outputs a signal at the H level or a signal at the L level in accordance with a comparison result to a signal line 15. The signal output from the comparator 3 is shifted (inverted) from the H level to the L level, or from the L level to the H level, when a magnitude relationship between an electric potential of the pixel signal and an electric potential of the ramp signal is changed. The storage unit 4 stores the count value as digital data at a timing at which the signal output from the comparator 3 is inverted. With this operation, the pixel signal is converted into the digital data (AD conversion). Herein, the comparator 3 is supplied with a control signal for controlling the operation of the comparator 3 from the control signal generation unit 9 via the signal line 52. An AD conversion unit includes at least the comparator 3 and the storage unit 4. An AD converter according to the present exemplary embodiment is a so-called ramp-type AD converter.

The horizontal scanning unit 5 outputs a control signal for controlling an output of the signal of the storage unit 4 to a signal line 16. The digital data stored in the storage unit 4 is output to a signal line 14 by the control signal of the horizontal scanning unit 5 and sequentially transferred to the signal processing unit 8. The signal processing unit 8, after performing signal processing such as correlated double sampling (hereinafter, will be referred to as a CDS) by using the digital data, outputs the signal to outside of the image pickup apparatus.

According to the present exemplary embodiment, the single reading unit 2 and the single comparator 3 are provided with respect to the single pixel column, but the single reading unit 2 and the single comparator 3 may be provided with respect to a plurality of pixel columns. Alternatively, the image pickup apparatus may have a configuration without the reading unit 2.

Figure 2:
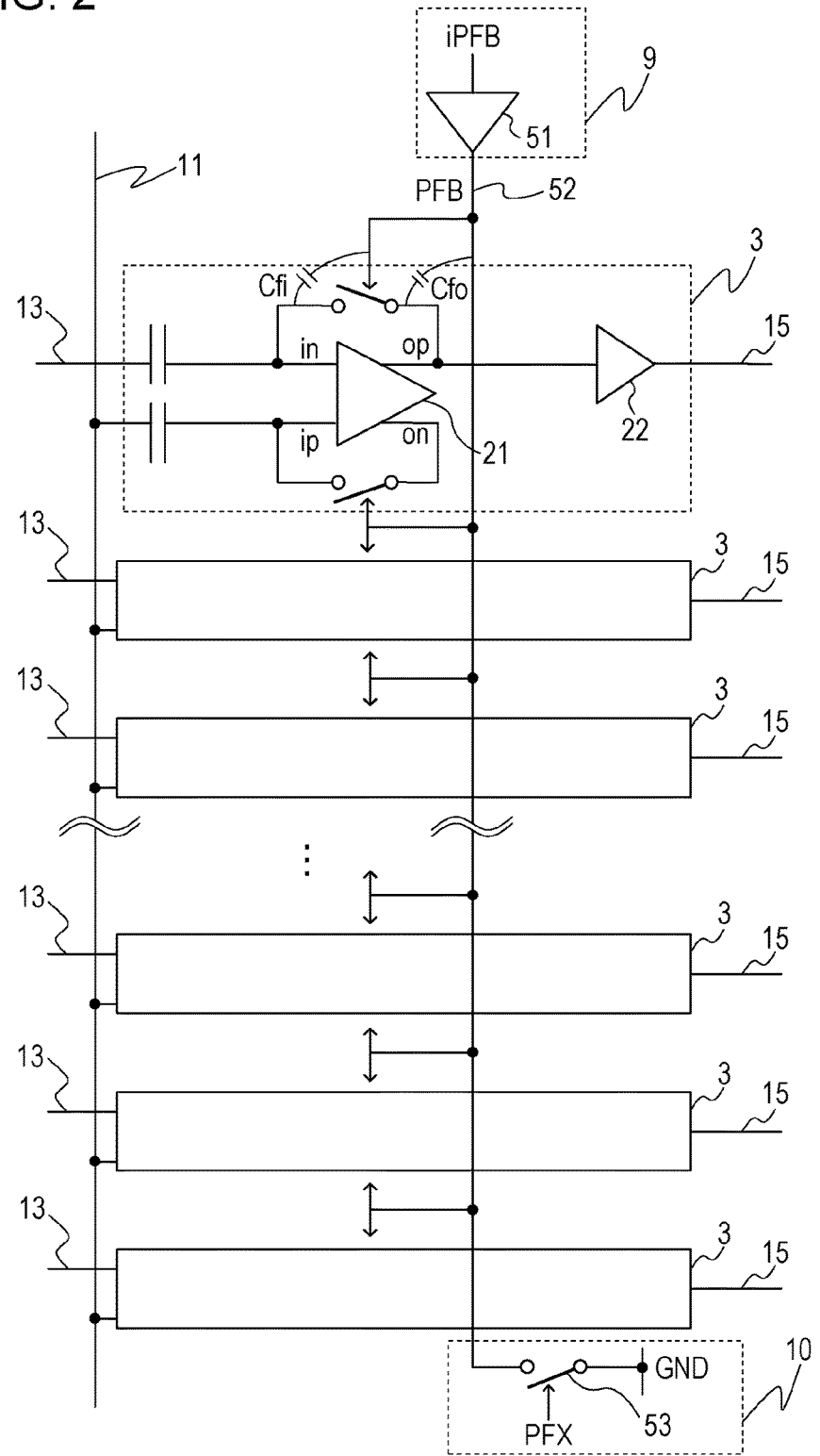
FIG. 2 is a circuit diagram for describing a comparator according to the first exemplary embodiment.

FIG. 2 is a circuit diagram illustrating a configuration of the plurality of comparators 3. FIG. 2 illustrates a circuit configuration of the single comparator 3, but the other comparators 3 also have the same configuration. FIG. 2 is a diagram obtained by rotating the block diagram of FIG. 1 counterclockwise by 90 degrees. Each of the plurality of comparators 3 includes a differential amplifier circuit 21, an output circuit 22, and two capacitors for inputs. The differential amplifier circuit 21 includes a feedback (hereinafter, will be referred to as an FB) switch that controls formation of an FB path. The FB switches of the respective comparators 3 are supplied with a control signal PFB from the common signal line 52. The control signal generation unit 9 includes a buffer 51. The buffer 51, to which an original signal iPFB has been input, outputs the control signal PFB to the signal line 52.

Herein, as also illustrated in FIG. 1, the image pickup apparatus includes the signal line control unit 10 connected to the signal line 52. The signal line control unit 10 includes a circuit configured to control an electric potential of the signal line 52 to be set as a fixed electric potential and operates such that the electric potential of the signal line 52 is set as or set to be close to the fixed electric potential. According to the present exemplary embodiment, the signal line control unit 10 includes a power source GND that supplies the ground electric potential as the fixed electric potential and a switch 53. ON and OFF of the switch 53 is controlled by a control signal PFX. In a case where the switch 53 turns to OFF by the control signal PFX, the signal line control unit 10 does not operate, and in a case where the switch 53 turns to ON by the control signal PFX, the signal line control unit 10 operates. According to the above-described configuration, the electric potential of the signal line 52 is controlled to be set as a constant electric potential by the control signal generation unit 9 and the signal line control unit 10. Therefore, in a case where an output of a certain comparator 3 is inverted, it is possible to suppress a fluctuation caused by the inversion to be propagated to the other comparator 3 via the signal line 52.

Figure 3A:
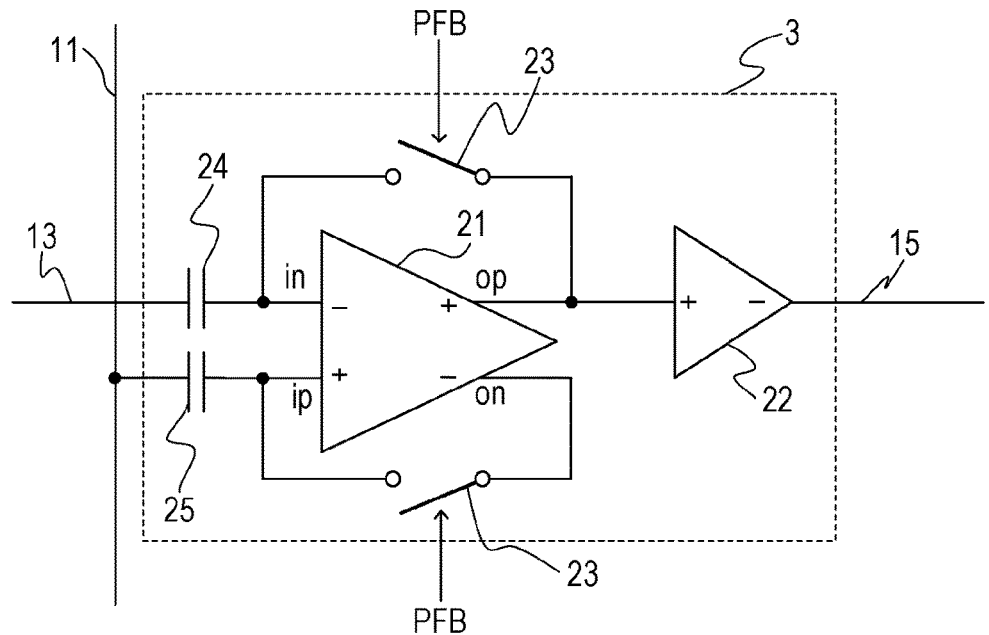
FIGS. 3A and 3B are circuit diagrams for describing the comparator according to the first exemplary embodiment.
Figure 3B:
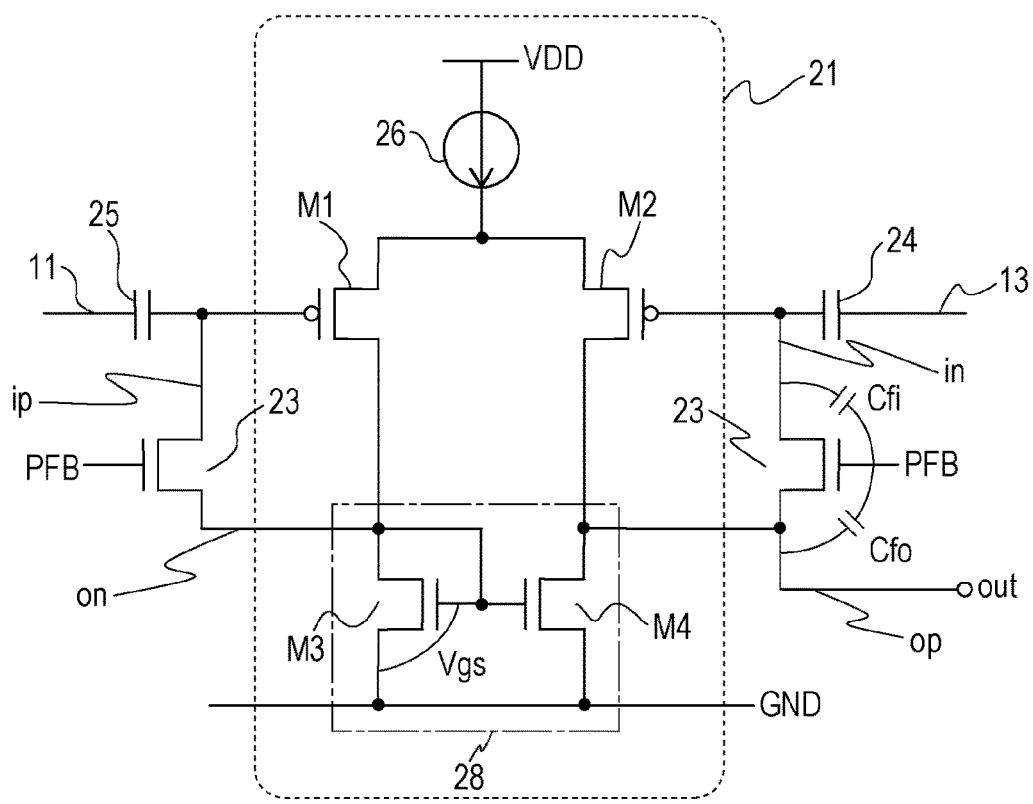

Hereinafter, the present exemplary embodiment will be described in more detail. FIG. 3A and FIG. 3B are detailed circuit diagrams illustrating the comparator 3 illustrated in FIG. 2. FIG. 3B is a detailed circuit diagram illustrating the differential amplifier circuit 21 of FIG. 3A.

As illustrated in FIG. 3A, the comparator 3 includes the differential amplifier circuit 21, the output circuit 22, and two capacitors 24 and 25 for the inputs. The differential amplifier circuit 21 includes a non-inverting input terminal "ip", an inverting input terminal "in", a non-inverting output terminal "op", an inverting output terminal "on", and two FB switches 23. One of the FB switches 23 has one end connected to the inverting input terminal in and the other end connected to the non-inverting output terminal op and controls connection between the inverting input terminal in and the non-inverting output terminal op. The other FB switch 23 has one end connected to the non-inverting input terminal ip and the other end connected to the inverting output terminal on and controls connection between the non-inverting input terminal ip and the inverting output terminal on. It is noted that the output of the differential amplifier circuit 21 is the non-inverting output terminal op, and the non-inverting output terminal op is connected to an input terminal of the output circuit 22. The capacitor 24 is connected to the inverting input terminal in, and the capacitor 25 is connected to the non-inverting input terminal ip. The signal line 13 is connected to the inverting input terminal in via the capacitor 24, and the signal line 11 is connected to the non-inverting input terminal ip via the capacitor 25. The signal line 11 is supplied with the ramp signal. The output circuit 22 is a source ground amplification circuit. An output terminal of the output circuit 22 is connected to the signal line 15, and the signal output from the output circuit 22 corresponds to the signal output from the comparator 3.

FIG. 3B is a detailed circuit diagram of the differential amplifier circuit 21. The differential amplifier circuit 21 includes a differential input transistor pair, a current source 26, and a current mirror circuit 28. The differential input transistor pair corresponds to P-type MOS transistors M1 and M2. The current source 26 is, for example, a constant current source and is connected to sources of the transistors M1 and M2. The current mirror circuit 28 is constituted by a transistor M3 having a diode connection between a drain and a gate, a transistor M4 having a gate connected to the gate of the transistor M3, and the power source GND having the ground electric potential, for example.

The two FB switches 23 are constituted by N-type MOS transistors. One of the FB switches 23 connects a gate and a drain of the transistor M1 to each other, and the other FB switch 23 connects a gate and a drain of the transistor M2 to each other. The gate of the transistor M1 is the non-inverting input terminal ip and is connected to the signal line 11 via the capacitor 25. The drain of the transistor M1 is the inverting output terminal on and is connected to the drain of the transistor M3 where the diode connection is established. The gate of the transistor M2 is the inverting input terminal in and is connected to the signal line 13 via the capacitor 24. The drain of the transistor M2 is the non-inverting output terminal op and is connected to a drain of the transistor M4 where the diode connection is established. Herein, a capacitance Cfi illustrated in FIG. 2 and FIG. 3B denotes a parasitic capacitance generated between the signal line 52 and the inverting input terminal in. A capacitance Cfo illustrated in FIG. 2 and FIG. 3B denotes a parasitic capacitance generated between the signal line 52 and the non-inverting output terminal op.

Figure 4:
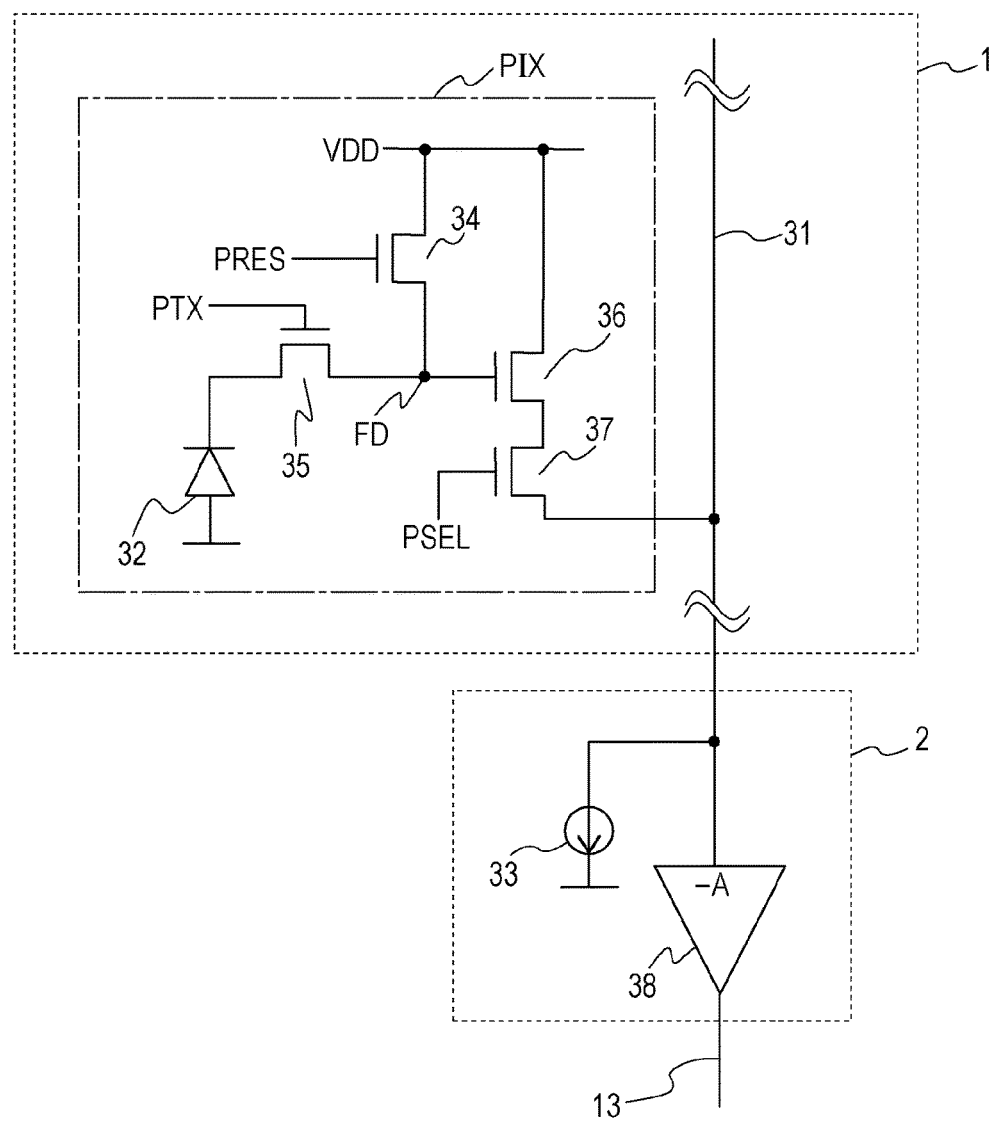
FIG. 4 is a circuit diagram for describing a pixel and a reading unit according to the first exemplary embodiment.

FIG. 4 illustrates a circuit of a single pixel PIX in the pixel unit 1 and the single reading unit 2. The pixel PIX is a circuit of a typical CMOS image sensor and includes a photoelectric conversion element 32, a reset transistor 34, a transfer transistor 35, an amplification transistor 36, and a selection transistor 37. The reset transistor 34, the transfer transistor 35, and the amplification transistor 36 are connected to a node of floating diffusion (hereinafter, will be referred to as an FD). The reset transistor 34, the transfer transistor 35, and the selection transistor 37 are respectively controlled by control signals PRES, PTX, and PSEL. When the pixel signal is read out, the control signal PSEL turns to the H level, and the selection transistor 37 is turned ON. At this time, the amplification transistor 36 and a current source 33 included in the reading unit 2 form a source follower circuit. The reading unit 2 is connected to a signal line 31 to which the pixel signal is output. The reading unit 2 is constituted by the current source 33 and an amplifier 38 having a gain of factor −A.

An operation when the pixel signal is read out from the pixel PIX is as follows. The control signal PRES turns to the H level, the reset transistor 34 is turned ON, and the reset transistor 34 resets the FD. Subsequently, the control signal PRES turns to the L level, and the reset transistor 34 is turned OFF. Herein, while the selection transistor 37 is put into an ON state, a signal (reset signal) based on an electric potential of the reset FD is output to the signal line 31. Thereafter, the control signal PTX turns to the H level, and electric charges accumulated in the photoelectric conversion element 32 are transferred to the FD. At this time, the electric potential of the FD is changed by the electric charges generated in the photoelectric conversion element 32. A signal (image signal) based on the changed electric potential of the FD is output to the signal line 31. In the amplifier 38, both the reset signal and the image signal are multiplied by −A to be output. The reset signal and the image signal output from the pixel are referred to as a pixel signal.

Figure 5:
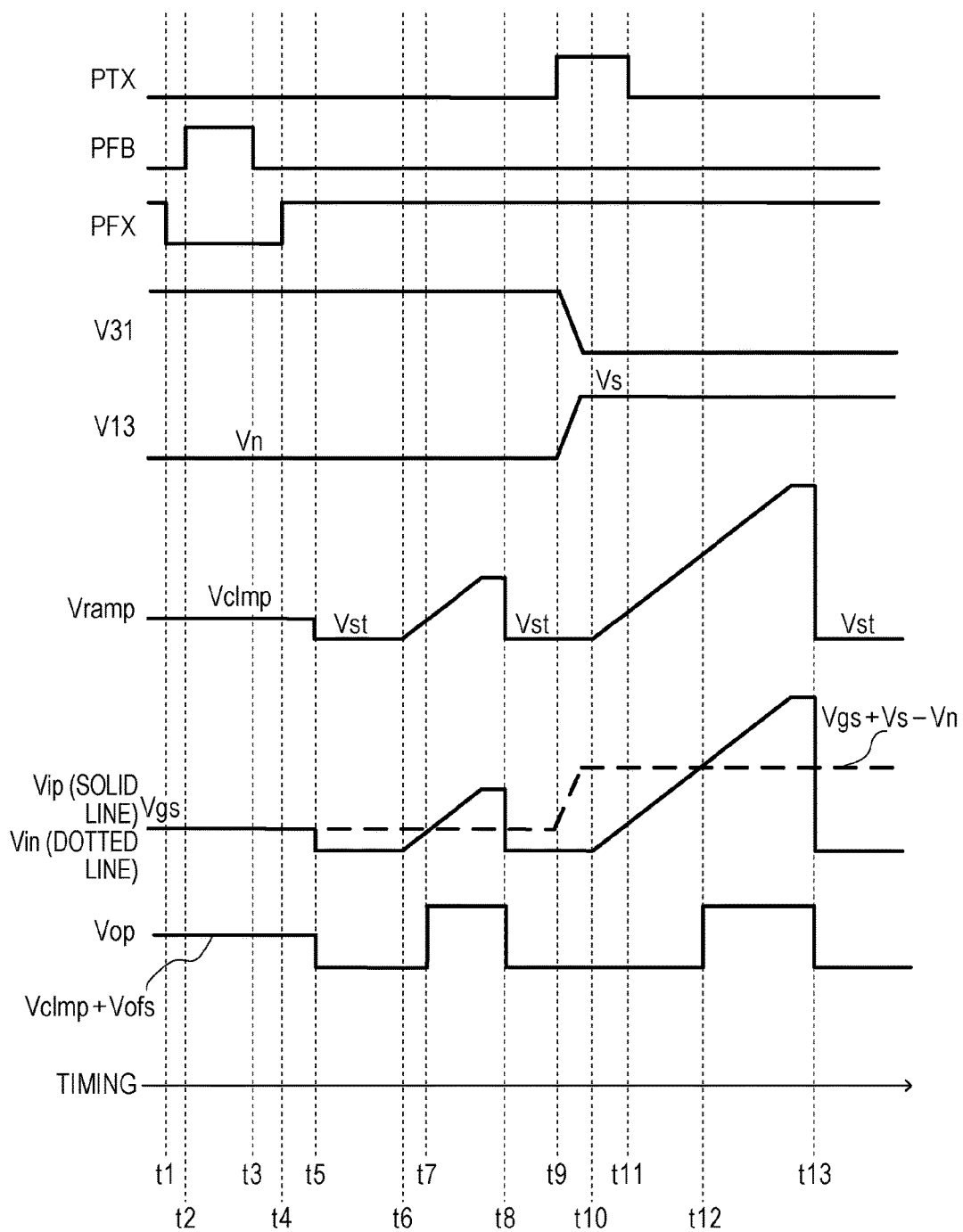
FIG. 5 is a timing chart for describing a driving method for the image pickup apparatus according to the first exemplary embodiment.

An operation of the image pickup apparatus having the above-described circuit configuration according to the present exemplary embodiment will be described with reference to FIG. 5. FIG. 5 is a timing chart for describing the operation from the pixel PIX up to the comparator 3. FIG. 5 illustrates the control signal PTX, the control signal PFB, the control signal PFX, an electric potential V31 of the signal line 31, an electric potential V13 of the signal line 13, and an electric potential Vramp of the ramp signal. Furthermore, FIG. 5 illustrates an electric potential Vip (solid line) of the non-inverting input terminal ip of the differential amplifier circuit 21, an electric potential Vin (dotted line) of the inverting input terminal in of the differential amplifier circuit 21, and an electric potential Vop of the non-inverting output terminal op of the differential amplifier circuit 21. The outputs of the other control signal PSEL and control signal PRES of the pixel PIX and the output of the comparator 3 will be omitted to simplify the descriptions.

At a time t1, the reset signal is output from the pixel PIX, and the electric potential V13 turns to an electric potential Vn indicating the reset signal. At this time, the control signal PFX turns to the L level. The electric potential Vramp of the ramp signal corresponds to an electric potential Vclmp for offset cancelling. The electric potential Vop corresponds to the electric potential Vclmp+an electric potential Vofs. The electric potential Vofs is an offset electric potential of the differential amplifier circuit 21.

At a time t2, the control signal PFB turns to the H level. That is, the FB switch 23 is turned ON, and an electric potential of the gate of the transistor M1 turns to an electric potential Vgs corresponding to an electric potential of the gate of the transistor M3. Since the source has the ground electric potential, the electric potential of the gate of the transistor M3 is equal to the electric potential Vgs between the gate and the source (see FIG. 3B). At this time, a current flowing between the drain and the source of the transistor M4 is equal to a current flowing between the drain and the source of the transistor M3. Therefore, an electric potential of the drain of the transistor M4 and an electric potential of the gate of the transistor M2 having the same node as the drain of the transistor M4 also turn to the electric potential Vgs. That is, the electric potential Vin and the electric potential Vop indicate the electric potential Vgs. Herein, an electric potential difference between the terminals of the capacitor 24 and an electric potential difference between the terminals of the capacitor 25 correspond to the electric potential Vclmp−the electric potential Vgs.

At a time t3, the control signal PFB turns to the L level. That is, the FB switch 23 is turned OFF, and each of the capacitor 24 and the capacitor 25 holds a difference corresponding to the electric potential Vclmp−the electric potential Vgs. With this operation, it is possible to perform offset cancelling in the differential amplifier circuit 21 constituting the comparator 3.

At a time t4, the control signal PFX turns to the H level, and at a time t5, the electric potential Vramp of the ramp signal is decreased to an electric potential Vst. At a time t6, an electric potential Vramp starts to be increased, and AD conversion is started. With regard to the electric potential Vip, along with a change in the ramp signal, the electric potential is decreased at the time t5, and the electric potential is increased at the time t6. On the other hand, the electric potential Vop remains the electric potential Vgs from the time t5. Subsequently, at a time t7, the electric potential Vip exceeds the electric potential Vgs, and the electric potential Vop turns from the L level to the H level. That is, the output of the comparator 3 turns from the H level to the L level. The storage unit 4 stores a count value at this time as the digital data of the reset signal. At a time t8, the electric potential Vramp of the ramp signal is decreased to the electric potential Vst again. Up to this point, AD conversion of a noise signal is completed.

Next, at a time t9, when the control signal PTX turns from the L level to the H level, a period is established during which the image signal is output from the pixel PIX. The electric potential V13 turns to an electric potential Vs indicating the image signal. At this time, the electric potential Vin corresponds to the electric potential Vgs+the electric potential Vs−the electric potential Vn. At a time t10, the electric potential Vramp starts to be increased, and AD conversion of the image signal is started. Herein, for example, at a time t11, the control signal PTX returns to the L level. At a time t12, when the electric potential Vip exceeds a value corresponding to the electric potential Vgs+the electric potential Vs−the electric potential Vn, the electric potential Vop turns from the L level to the H level. That is, the output of the comparator 3 turns from the H level to the L level. The storage unit 4 stores a count value at this time as the digital data of the image signal. Thereafter, at a time t13, the electric potential Vramp corresponding to the electric potential of the ramp signal is decreased to the electric potential Vst again. Up to this point, the AD conversion of the image signal is completed. Thereafter, subtraction of the reset signal and the digital data of the image signal stored in the storage unit 4 is performed to carry out the output in the signal processing unit 8, and the AD conversion of the single pixel is ended.

According to the present exemplary embodiment, before the control signal PFB turns from the L level to the H level, the control signal PFX turns from the H level to the L level, and after the control signal PFB turns from the H level to the L level, the control signal PFX turns from the L level to the H level. That is, during an offset cancelling period during which the control signal PFB is at the H level, the signal line control unit 10 does not operate. During an AD conversion period of the reset signal and the pixel signal (corresponding to a period between the time t6 and the time t8 and a period between the time t10 and the time t13), the signal line control unit 10 operates to perform control such that the electric potential of the signal line 52 is set as the fixed electric potential. With this operation, the crosstalk to the other comparator 3 can be suppressed, and it is possible to reduce the error of the AD conversion.

This crosstalk phenomenon will be described with reference to FIG. 6 to FIG. 9. First, a comparison example of the present exemplary embodiment will be described with reference to FIG. 7 to FIG. 9.

Figure 7:
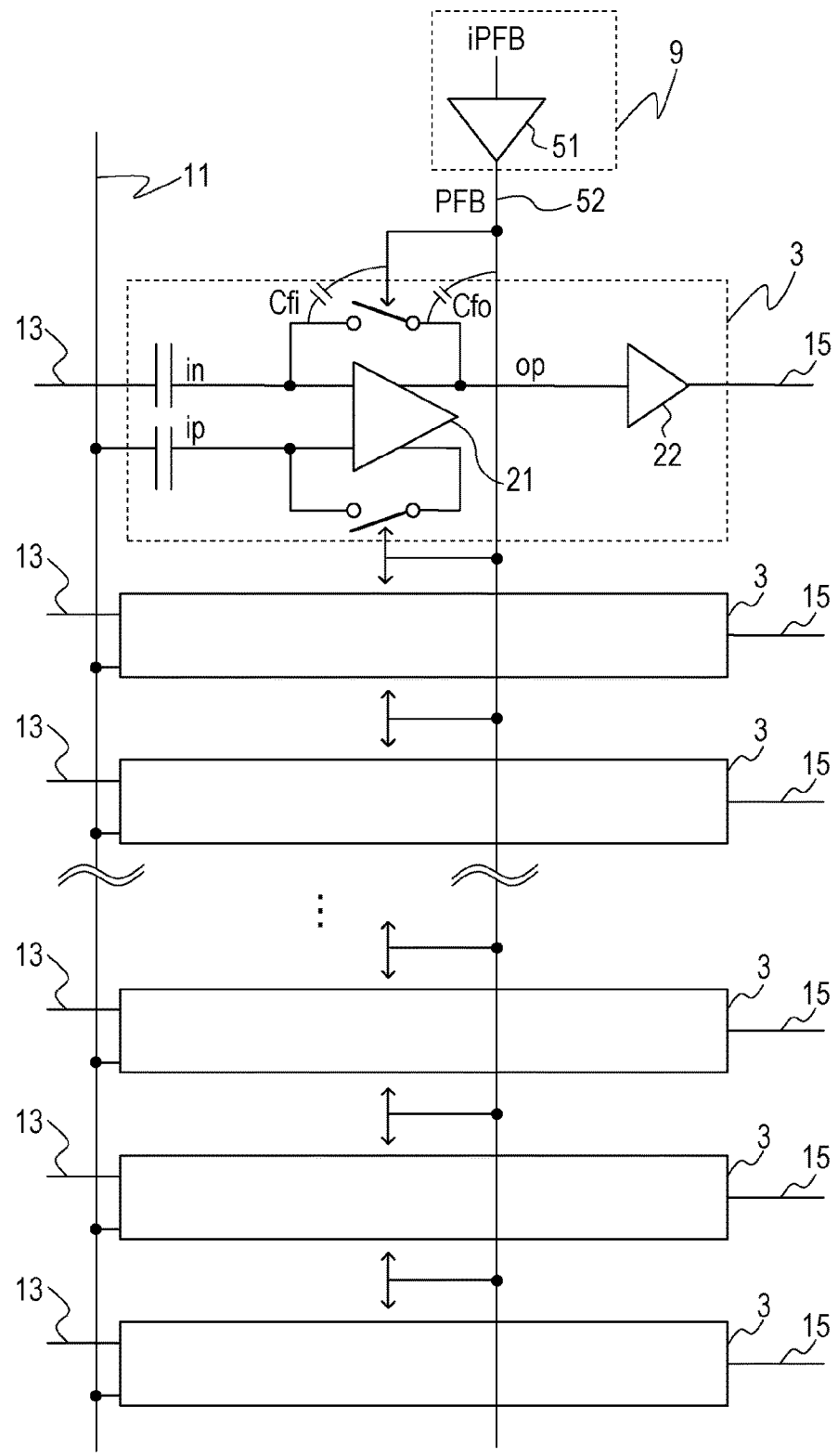
FIG. 7 is a circuit diagram for describing a comparator according to a comparison example of the first exemplary embodiment.

FIG. 7 is a circuit diagram illustrating the plurality of comparators 3 of the image pickup apparatus according to a comparison example of the present exemplary embodiment. FIG. 7 corresponds to FIG. 2, and detailed explanations of the components described in FIG. 2 will be omitted. FIG. 7 is different from FIG. 2 in that the image pickup apparatus is not provided with the signal line control unit 10.

Figure 8:
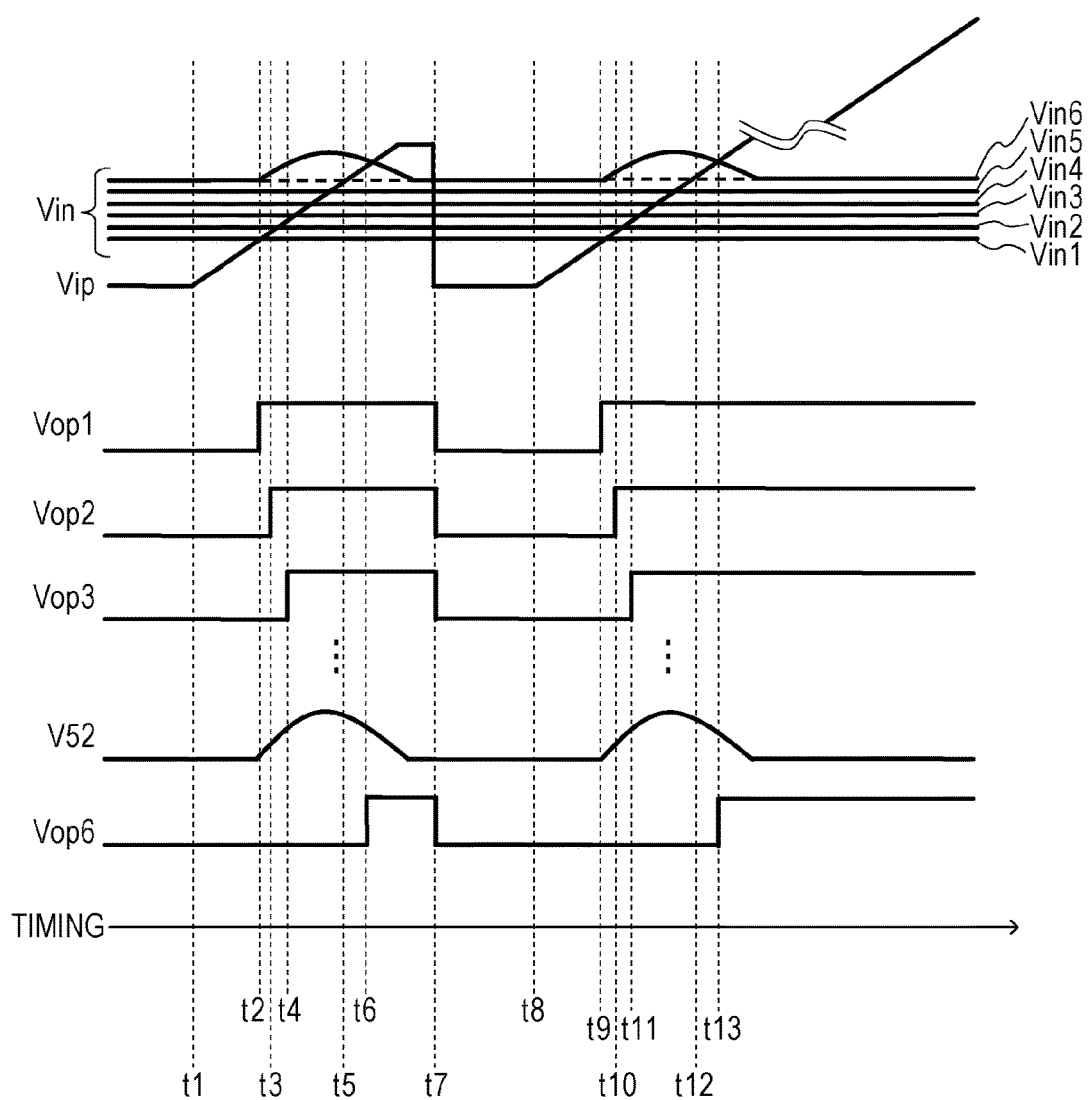
FIG. 8 is a timing chart for describing the comparison example of the first exemplary embodiment.

FIG. 8 is a timing chart illustrating the AD conversion period of the reset signal and the image signal when light is not incident on the pixel unit 1, that is, in darkness. FIG. 8 illustrates electric potentials of the respective terminals of the differential amplifier circuit 21 in the comparator 3 and an electric potential V52 of the signal line 52. The electric potential Vip of the non-inverting input terminal ip, the electric potential Vin of the inverting input terminal in, and the electric potential Vop of the non-inverting output terminal op are illustrated as the electric potentials of the respective terminals of the differential amplifier circuit 21. FIG. 8 illustrates respective electric potential of the plurality of comparators 3 provided in association with the first to sixth pixel columns. The plurality of comparators 3 are set as first to sixth comparators 3. Electric potentials Vin of the first to sixth comparators 3 are denoted by an electric potential Vin1 to an electric potential Vin6. On the other hand, electric potentials Vip of the first to sixth comparators 3 are set to have no fluctuations to simplify the descriptions and are denoted by one electric potential Vip. Electric potentials Vop of the first to sixth comparators 3 are denoted by an electric potential Vop1 to an electric potential Vop6. It is noted that an electric potential Vop4 and an electric potential Vop5 are omitted in FIG. 8.

At the time t1, AD conversion of the reset signal is started. A count value at the time of starting this AD conversion is 0. At the time t2, a magnitude relationship between the electric potential Vin1 of the first pixel column and the electric potential Vip is changed, and the electric potential Vop1 turns from the L level to the H level. With regard to transition of the electric potential Vop1 toward a plus (hereinafter, will be referred to as +) direction, the electric potential V52 of the signal line 52 is changed in the + direction via the parasitic capacitance Cfo between the non-inverting output terminal op and the signal line 52 illustrated in FIG. 7. However, since the signal line 52 is controlled to be at the L level by the control signal generation unit 9, the signal line 52 returns to the original electric potential after a certain period of time has elapsed. As a result, the electric potential V52 of the signal line 52 has a waveform that is convex upward. At this time, it is conceivable that the parasitic capacitances Cfo and Cfi in the vicinity of the FB switch 23 are main factors of the fluctuation of the signal line 52. However, the fluctuation of the signal line 52 may also be caused by a parasitic capacitance between a line or the like connected to the non-inverting output terminal op and the signal line 52 or a parasitic capacitance between a line or the like connected to the inverting input terminal in and the signal line 52.

At the time t3, a magnitude relationship between the electric potential Vin2 of the second pixel column and the electric potential Vip is changed, and at the time t4, a magnitude relationship between the electric potential Vin3 of the third pixel column and the electric potential Vip is changed. Therefore, the corresponding electric potential Vop2 and electric potential Vop3 turn from the L level to the H level at the respective times. The transitions of the electric potential Vop2 and the electric potential Vop3 toward the + direction also change the electric potential V52 in the + direction. The fluctuation of the electric potential V52 caused at the time t3 is overlapped with the fluctuation of the electric potential Vop1, and the fluctuation caused at the time t4 is overlapped with the fluctuation of the electric potential V52 caused at the time t3. The electric potential Vop4 and the electric potential Vop5 corresponding to the electric potential Vin4 and the electric potential Vin5 also similarly change the electric potential V52. That is, after the electric potential V52 fluctuates, before the electric potential V52 returns to the original electric potential, if the electric potential Vop of the other pixel column turns from the L level to the H level, the fluctuation of the electric potential V52 is increased. In addition, as more pixel columns where the electric potential Vop turn from the L level to the H level at the same time exist, the fluctuation of the electric potential V52 is further increased.

Herein, the fluctuation of the electric potential V52 changes the electric potential Vin of the inverting input terminal in via the parasitic capacitance Cfi between the signal line 52 and the inverting input terminal in illustrated in FIG. 7. This fluctuation is represented by the electric potential Vin6 between the time t2 to the time t7 in FIG. 8. It is noted that a state in which no influence of the crosstalk exists in the electric potential Vin6 is represented by a dotted line for comparison. Since the electric potential Vin6 is higher than the electric potential Vin0 to the electric potential Vin5, before a magnitude relationship between the electric potential Vin6 and the electric potential Vip is changed, the electric potential Vop1 to the electric potential Vop5 carry out transitions. Fluctuations caused by the transitions of the electric potential Vop1 to the electric potential Vop5 affect the value of the electric potential Vin6.

At the time t6, a magnitude relationship between the electric potential Vin6 and the electric potential Vip is changed, and the electric potential Vop6 turns from the L level to the H level. A count value at the time t6 is held in the storage unit 4. However, if no influence of the crosstalk exists, the transition of the electric potential Vop6 would have occurred at the time t5. That is, an error is caused in the digital data by the fluctuation of the signal line 52 by an amount corresponding to the counting from the time t5 to the time t6.

At the time t7, the electric potential Vip returns to the electric potential before starting the AD conversion, and the counter is also reset, so that the count value turns to 0. Subsequently, the AD conversion of the image signal is started from the time t8. It is noted that since the image signal when the imaging is performed in darkness, the electric potential Vin1 to the electric potential Vin6 have substantially the same values as the electric potential Vin1 to the electric potential Vin6 of the reset signal. Therefore, from the time t9 to the time t11, operations similar to those from the time t2 to the time t4 are performed. That is, sequentially, changes in the magnitude relationships between the electric potential Vip and the electric potential Vin1, the electric potential Vin2, and the electric potential Vin3 are caused, and the electric potential Vop1, the electric potential Vin2, and the electric potential Vop3 turn from the L level to the H level. Transitions of the electric potential Vop4 and the electric potential Vop5 corresponding to the electric potential Vin4 and the electric potential Vin5 are also similarly carried out. Therefore, the influence of the fluctuation is caused in the electric potential V52, and the fluctuation of the electric potential Vin6 occurs. Because of the fluctuation, the time when the electric potential Vop6 turns from the L level to the H level corresponds to the time t13 instead of the time t12.

Herein, at the time of the imaging in darkness, if values of the reset signals of the electric potential Vin1 to the electric potential Vin6 are not largely different from values of image pickup signals, a fluctuation caused in the reset signal of the electric potential Vin6 may be substantially equal to a fluctuation caused in the image pickup signal. In this case, when CDS processing for subtracting the digital data of the reset signal from the digital data of the image signal is performed, it is possible to eliminate or reduce the error. However, in a case where the image pickup apparatus is used, since the value of the reset signal is different from the value of the image pickup signal in many cases, it is difficult to reduce the error. In addition, even at the time of the imaging in darkness, if a defective pixel or the like exists, the error may be caused.

Figure 9:
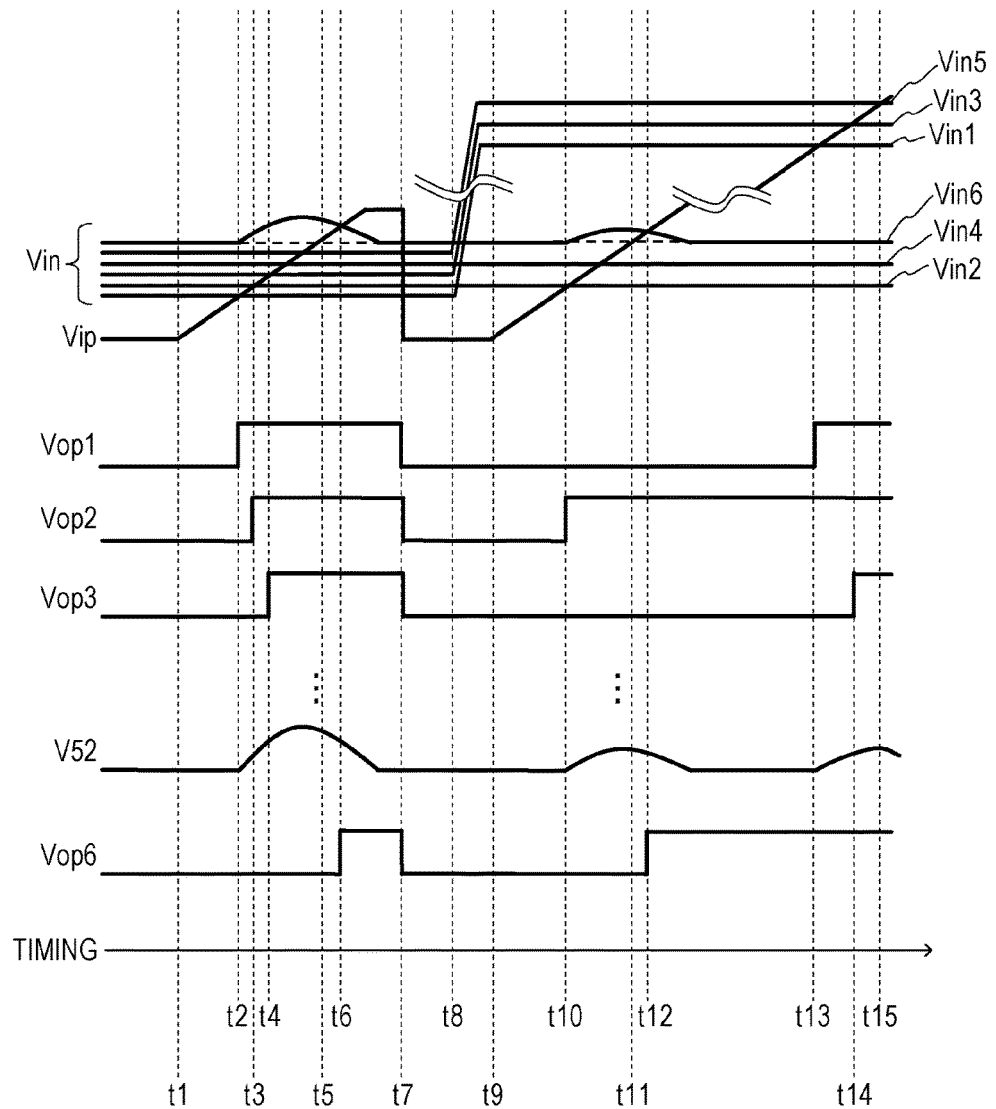
FIG. 9 is a timing chart for describing the comparison example of the first exemplary embodiment.

Furthermore, a case where light is incident on the pixel unit 1 will be described with reference to FIG. 9. FIG. 9 is a timing chart illustrating the AD conversion period of the reset signal and the image signal in a case where the light is incident on the pixel unit 1. FIG. 9 corresponds to FIG. 8, and descriptions of the components having the same reference symbols will be omitted. The same operations are performed from the time t1 to the time t7 as those from the time t1 to the time t7 of FIG. 8, and the descriptions thereof will be omitted.

At the time t8, the image signal is output from the pixel PIX, and the electric potential Vin1 to the electric potential Vin6 are changed. Herein, light is incident on the first, third, and fifth pixel columns among the first to sixth pixel columns.

At the time t9, the AD conversion of the image signal is started. At the time t10, the magnitude relationship between the electric potential Vin1 and the electric potential Vip is changed, and the electric potential Vop2 turns from the L level to the H level. At this time, the electric potential V52 fluctuates along with the transition of the electric potential Vop2. Thereafter, a magnitude relationship between the electric potential Vin4 and the electric potential Vip is changed, and the electric potential Vop4 turns from the L level to the H level (not illustrated). At this time, a fluctuation along with the transition of the electric potential Vop2 and also a fluctuation along with the transition of the electric potential Vop4 occur in the electric potential V52. At this time, the electric potential Vin6 fluctuates via the signal line 52.

Subsequently, at the time t12, a magnitude relationship between the electric potential Vin6 and the electric potential Vip is changed, and the electric potential Vop6 turns from the L level to the H level. Similarly as in FIG. 8, if no fluctuation occurs, a change in the magnitude relationship between the electric potential Vin6 and the electric potential Vip would have occurred at the time t11.

Thereafter, at the time t13, the magnitude relationship between the electric potential Vin1 and the electric potential Vip is changed, and the electric potential Vop1 turns from the L level to the H level. At a time t14, the magnitude relationship between the electric potential Vin3 and the electric potential Vip is changed, and the electric potential Vop3 turns from the L level to the H level. At a time t15, a magnitude relationship between the electric potential Vin5 and the electric potential Vip is changed, and the electric potential Vop5 turns from the L level to the H level (not illustrated). At the time t13 to the time t15 too, since the electric potential V52 fluctuates along with the transitions of the electric potential Vop1 and the electric potential Vop3, the electric potential Vin5 fluctuates, and the time when the magnitude relationship between the electric potential Vin5 and the electric potential Vip is changed may be varied.

In the operations of FIG. 9, during the period of the AD conversion of the reset signal, the transitions of the electric potential Vop1 to the electric potential Vop5 affect the electric potential Vin6. On the other hand, during the AD conversion of the image signal, the transitions of the electric potential Vop2 and the electric potential Vop4 affect the electric potential Vin6. That is, the influence of the fluctuation that affects the electric potential Vin6 during the AD conversion of the reset signal is different from the influence during the AD conversion of the image signal. Therefore, even when the CDS processing is performed, the error is not eliminated.

As illustrated in FIG. 8 and FIG. 9, when the output of the comparator is inverted, the output of the comparator on the other column may be affected in some cases. That is, crosstalk is caused. When the crosstalk is caused, an error is caused in a result of the AD conversion on the other column. Next, the reduction of the crosstalk by the image pickup apparatus according to the present exemplary embodiment illustrated in FIG. 1 to FIG. 5 will be described with reference to FIG. 6.

Figure 6:
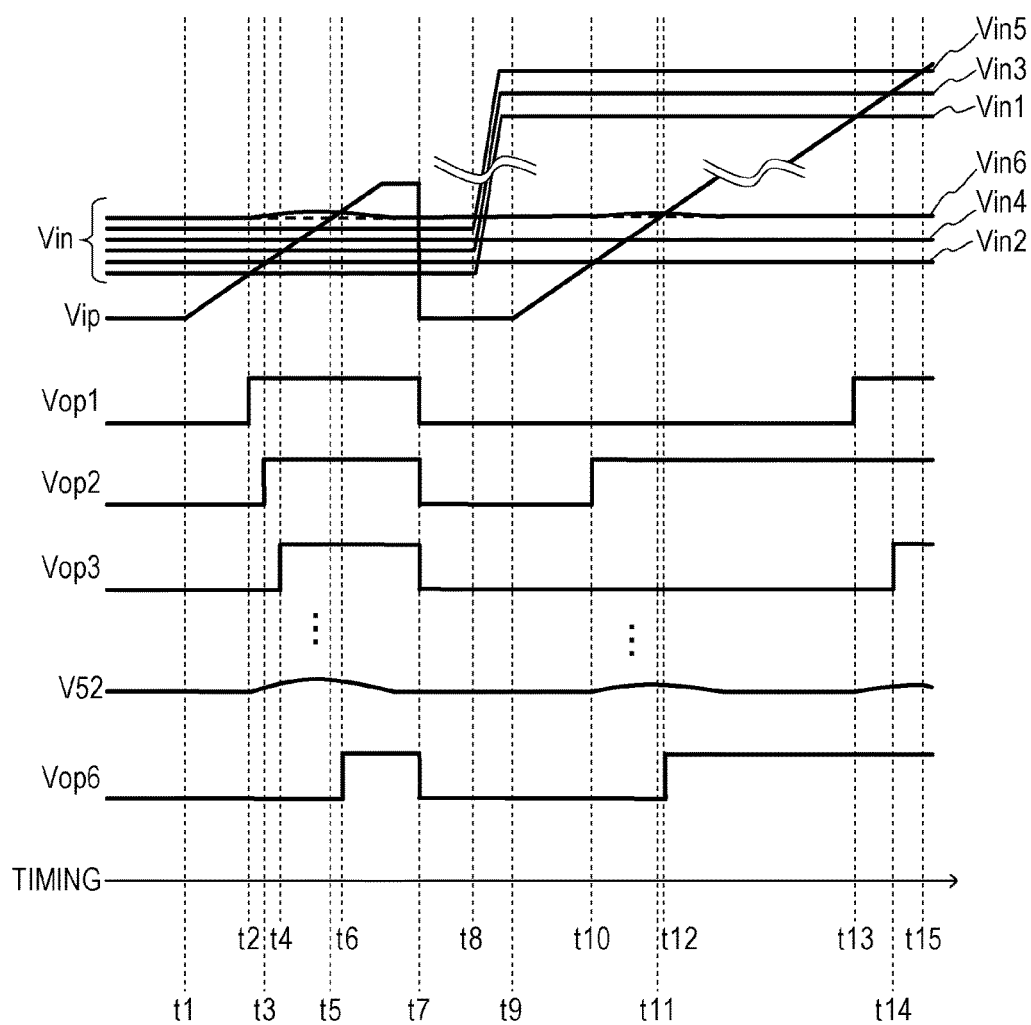
FIG. 6 is a timing chart for describing a driving method for the image pickup apparatus according to the first exemplary embodiment.

FIG. 6 is a timing chart illustrating the AD conversion period of the reset signal and the image signal in a case where light is incident on the pixel unit 1. FIG. 6 corresponds to FIG. 9, and descriptions of the same configurations will be omitted.

A period from the time t1 to the time t7 in FIG. 6 is an AD conversion period of a noise signal, and similar operations to those from the time t1 to the time t7 in FIG. 9 are performed. However, an amount of the fluctuation of the electric potential V52 caused from the time t2 is smaller than an amount of the fluctuation of the electric potential V52 in FIG. 9. Subsequently, an amount of the fluctuation of the electric potential Vin6 caused by the fluctuation of the electric potential V52 is also smaller than an amount of the fluctuation of the electric potential Vin6 in FIG. 9. This is because the signal line control unit 10 controls the electric potential V52 of the signal line 52 as illustrated in FIG. 1 and the like. Therefore, a count from the time t5 to the time t6 corresponding to the error is smaller than a count from the time t5 to the time t6 in FIG. 9.

A period from the time t8 to the time t15 in FIG. 6 is a period of the output of the image signal and the AD conversion of the image signal, and similar operations to those from the time t7 to the time t15 in FIG. 9 are performed. Similarly as in the AD conversion period of the noise signal, an amount of the fluctuation of the electric potential V52 caused from the time t10 is smaller than an amount of the fluctuation of the electric potential V52 in FIG. 9. Subsequently, an amount of the fluctuation of the electric potential Vin6 caused by the fluctuation of the electric potential V52 is also smaller than an amount of the fluctuation of the electric potential Vin6 in FIG. 9. This is because the signal line control unit 10 controls the electric potential V52 of the signal line 52 as illustrated in FIG. 1 and the like. Therefore, a count from the time t11 to the time t12 corresponding to the error is smaller than a count from the time t11 to the time t12 in FIG. 9.

In this manner, the crosstalk can be reduced, and it is possible to obtain the noise signal having the small error and the digital data of the image signal. Furthermore, when the CDS processing is performed, the error can be eliminated or further reduced.

According to the present exemplary embodiment, the case has been described where the error is caused at the time of the AD conversion of the pixel signal on the sixth pixel column, but the error may be caused at the time of the AD conversion on the other pixel column. However, it is also possible to reduce the error at the time of the AD conversion on the other pixel column by providing the signal line control unit 10.

According to the present exemplary embodiment, the signal line control unit 10 is arranged in a manner that the plurality of comparators 3 are positioned between the signal line control unit 10 and the control signal generation unit 9 as illustrated in FIG. 2. That is, the control signal generation unit 9 is connected to one end of the signal line 52, and the signal line control unit 10 is connected to the other end of the signal line 52. However, the signal line control unit 10 may be arranged between the mutual comparators 3. In the above-described example too, it is sufficient when the plurality of comparators 3 are arranged between the control signal generation unit 9 and the signal line control unit 10. The number of the signal line control units 10 is not limited to 1. In FIG. 1, the signal output from the pixel unit 1 is output to the reading unit 2 arranged on a lower side of the pixel unit 1 on the paper face of FIG. 1. The arrangement is not limited to this example. Signals of the pixels on the odd-numbered columns in the pixel unit 1 may be output to the reading unit 2 arranged on a first side in the pixel unit 1, and signals of the pixels on the even-numbered columns may be output to the reading unit 2 arranged on a second side opposite to the first side in the pixel unit 1. In this case, the pixel unit 1 is arranged between the reading unit 2 arranged on the first side and the reading unit 2 arranged on the second side. Subsequently, the comparator 3 is similarly arranged on the first side in association with the reading unit 2 arranged on the first side. The comparator 3 is similarly arranged on the second side in association with the reading unit 2 arranged on the second side. In this case, a pair of the control signal generation unit 9 and the signal line control unit 10 may be arranged in association with the comparator 3 on the first side, and another pair of the control signal generation unit 9 and the signal line control unit 10 may be arranged in association with the comparator 3 on the second side. In this case, the plurality of comparators 3 are arranged between the control signal generation unit 9 and the signal line control unit 10 on each of the first side and the second side.

The signal line control unit 10 may have a configuration similar to that of the control signal generation unit 9 illustrated in FIG. 2. That is, a configuration may be adopted in which the signal line 52 is controlled from both ends. However, according to the above-described configuration, since a through current may flow through the signal line 52, the configuration according to the present exemplary embodiment is desirable.

The two FB switches 23 of the respective comparators 3 are controlled by the same control signal PFB. However, for example, the two FB switches 23 may be respectively separately controlled by different control signals. In this case, it is desirable to provide the signal line control unit 10 to each of signal lines for the control signals.

Furthermore, the switch 53 of the signal line control unit 10 according to the present exemplary embodiment is connected to the power source GND, but the switch 53 may be connected to the power source VDD corresponding to the power source voltage instead of the power source GND or a line for supplying an arbitrary voltage.

It should be noted that, according to the present exemplary embodiment, the FB switch has been described as the switch configured to control the operation, but a switch configured to control the operation of the other comparator may also be used. An example of the switch configured to control the operation of the other comparator will be described below.

According to the present exemplary embodiment, the comparator provided to the ramp-type AD converter has been described. However, the configuration of the signal line control unit 10 can also be applied to a consecutive comparison-type AD converter or the like as long as a configuration in which the converter has a signal commonly provided to the switches is adopted. Not only the AD converter, but also, in a case where the signals are compared with each other, for example, the signal line control unit 10 described in the present exemplary embodiment can also be applied to the comparator in the image pickup apparatus having a function of switching a gain of the comparator in accordance with the comparison result and expanding a dynamic range or the like.

Second Exemplary Embodiment

Figure 10:
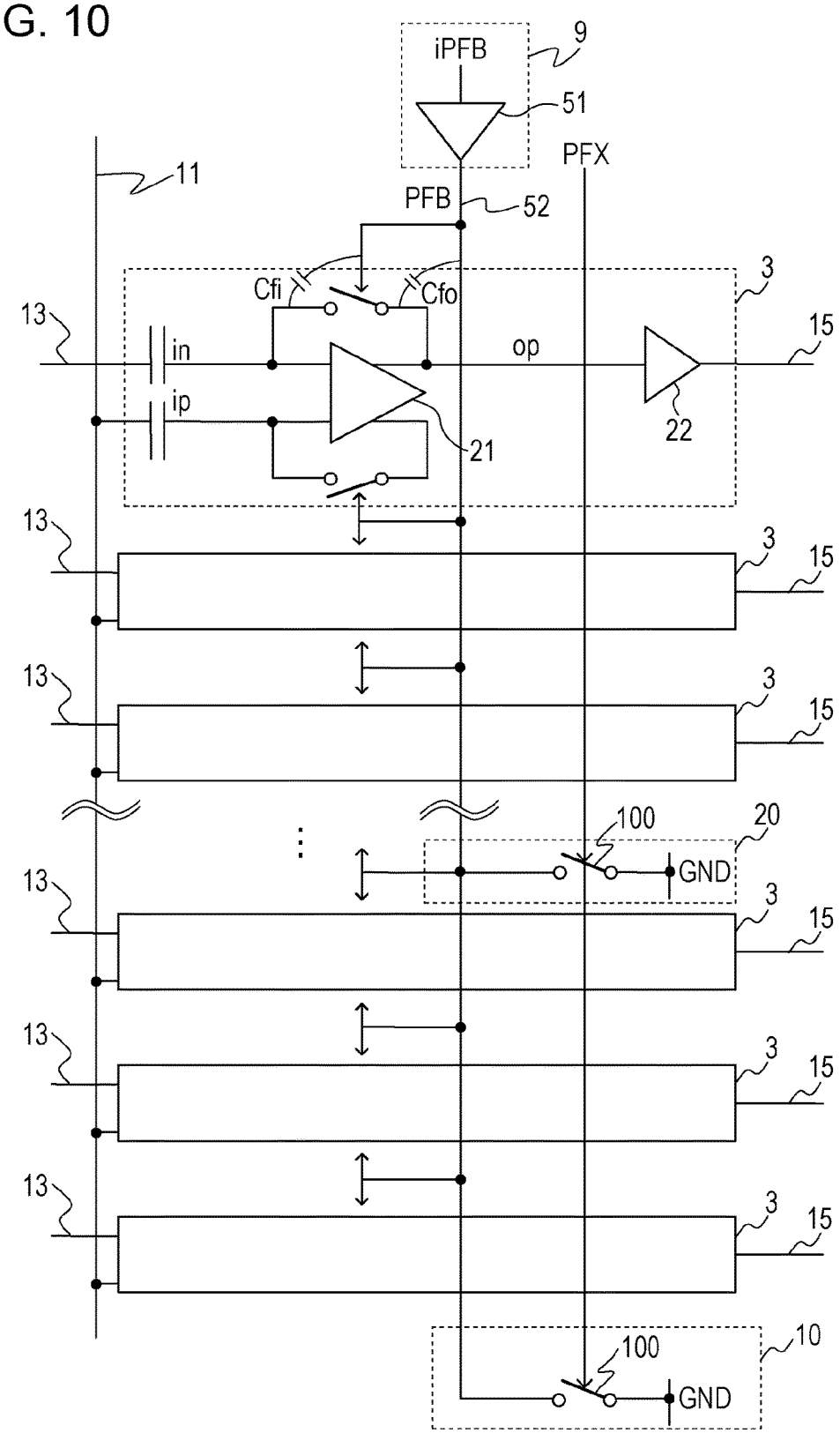
FIG. 10 is a circuit diagram for describing a comparator according to a second exemplary embodiment.

The present exemplary embodiment will be described with reference to FIG. 10. In FIG. 10, the same configurations as those of the first exemplary embodiment are assigned with the same reference symbols, and descriptions thereof will be omitted. In contrast to the provision of the single signal line control unit 10 according to the first exemplary embodiment, another signal line control unit 20 is provided in addition to the signal line control unit 10 according to the present exemplary embodiment. That is, according to the present exemplary embodiment, the plurality of signal line control units 10 and 20 are provided.

The signal line control unit 20 includes the power source GND and a switch 100 similarly as in the signal line control unit 10 according to the first exemplary embodiment. The signal line control unit 20 is arranged between the control signal generation unit 9 and the signal line control unit 10. The plurality of comparators 3 are arranged between the control signal generation unit 9 and the signal line control unit 20 and between the signal line control unit 10 and the signal line control unit 20. According to the above-described configuration, the fluctuation of the signal line 52 can be further reduced as compared with the case of the first exemplary embodiment, and it is possible to further reduce the error caused at the time of the AD conversion.

According to the present exemplary embodiment, the configuration has been described in which the image pickup apparatus includes the two signal line control units, but the image pickup apparatus may include further more signal line control units. In a case where a plurality of signal line control units are provided, the signal line control units are desirably arranged at equal intervals, but the configuration is not limited to this.

Third Exemplary Embodiment

Figure 11:
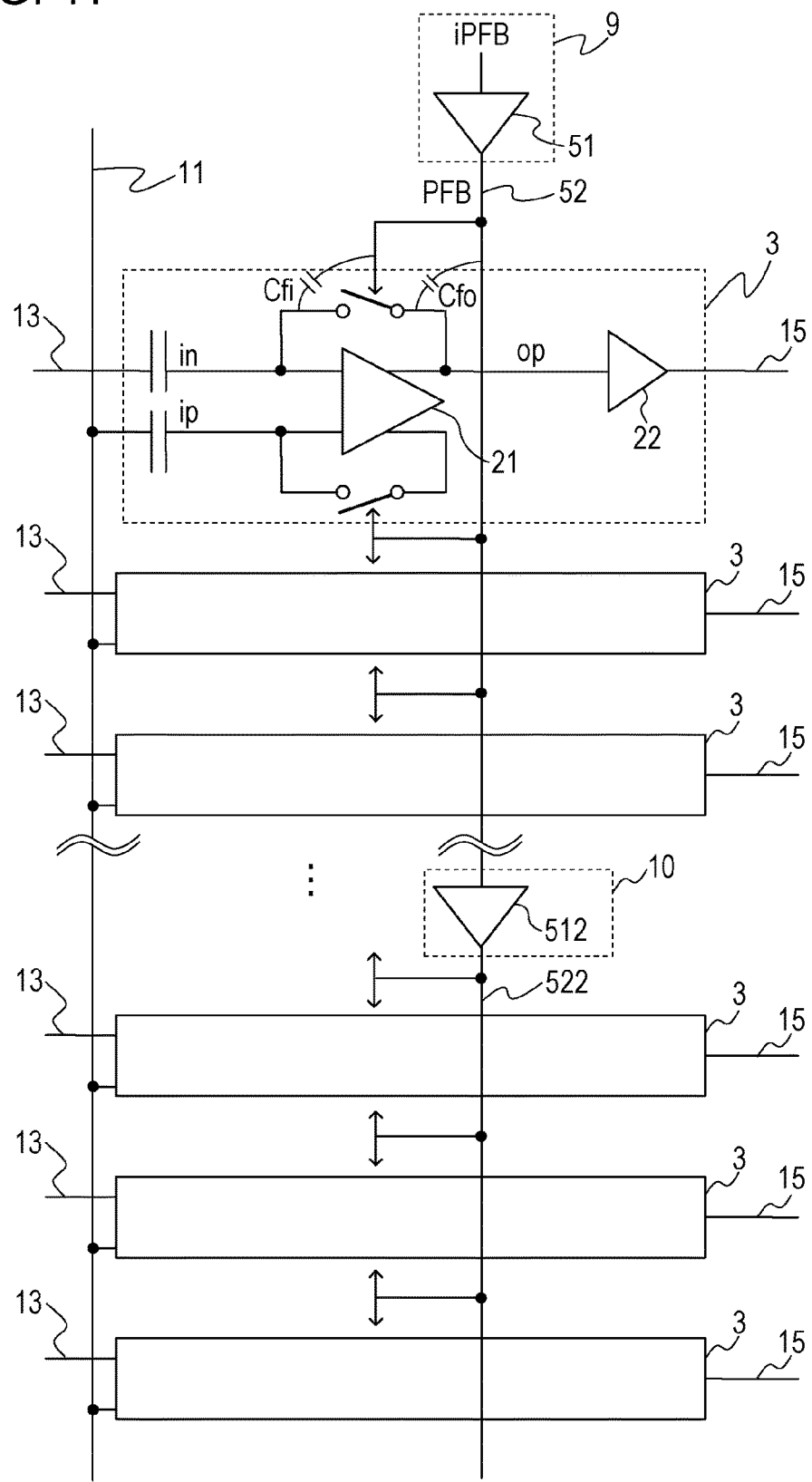
FIG. 11 is a circuit diagram for describing a comparator according to a third exemplary embodiment.

The present exemplary embodiment will be described with reference to FIG. 11. In FIG. 11, the same configurations as those of the first exemplary embodiment are assigned with the same reference symbols, and descriptions thereof will be omitted. The signal line control unit 10 according to the first exemplary embodiment is constituted by the power source GND and the switch 53, but according to the present exemplary embodiment, the signal line control unit 10 is constituted by a buffer 512.

The buffer 51 of the control signal generation unit 9 supplies the control signal PFB to the signal line 52. The control signal PFB is input to the buffer 512 of the signal line control unit 10 via the signal line 52, and the buffer 512 outputs a control signal based on the control signal PFB to a signal line 522. That is, since a resistance of the signal line driven by the single buffer is reduced, the fluctuations of the signal line 52 and the signal line 522 can be reduced as compared with the case of the first exemplary embodiment. Therefore, it is possible to further reduce the error caused at the time of the AD conversion.

It should be noted that the signal line control unit 10 according to the first exemplary embodiment may be provided to an end portion on a side opposite to the end portion of the signal line 522 connected with the buffer 512. These configurations can be appropriately combined with each other.

Fourth Exemplary Embodiment

Figure 12:
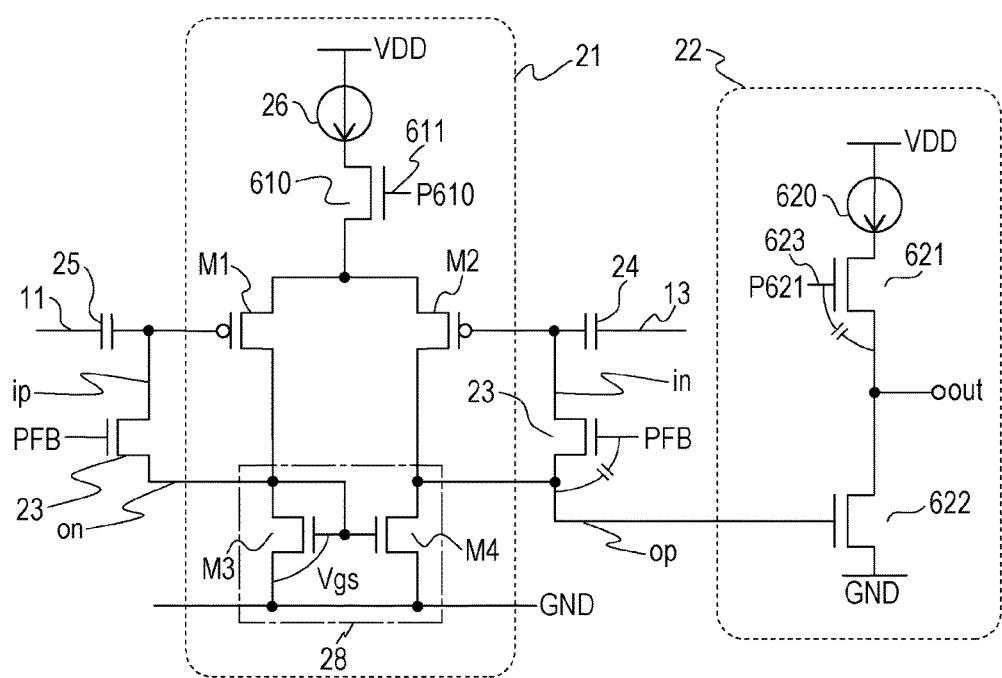
FIG. 12 is a circuit diagram for describing a comparator according to a fourth exemplary embodiment.

The present exemplary embodiment will be described with reference to FIG. 12. In FIG. 12, the same configurations as those of the first exemplary embodiment are assigned with the same reference symbols, and descriptions thereof will be omitted. The case of the FB switch 23 functioning as the switch for controlling the operation of the comparator 3 according to the first exemplary embodiment has been described, but according to the present exemplary embodiment, a case of a switch 610 of the current source 26 will be described.

FIG. 12 is a circuit diagram illustrating a detail of the comparator 3 corresponding to FIG. 3B according to the first exemplary embodiment. In FIG. 12, the differential amplifier circuit 21 includes the switch 610 that controls a conductive state between the current source 26 and the differential input transistor pair in addition to the configuration of FIG. 3B. In a case where the switch 610 is turned ON, the current is supplied from the current source 26, and the differential amplifier circuit 21 operates. In a case where the switch 610 is turned OFF, the current from the current source 26 is not supplied, and the differential amplifier circuit 21 does not operate. Therefore, while the current is supplied by the switch 610 when necessary, the power consumption can be reduced. In this manner, the switch 610 controls the operation of the comparator 3.

A signal line 611 through which a control signal P610 for controlling the operation of the switch 610 is supplied may also be provided commonly to the plurality of comparators 3 similarly as in the signal line 52 according to the first exemplary embodiment. In the above-described case too, while the signal line 611 is provided with the signal control unit, it is possible to reduce the crosstalk to the other comparators 3. Therefore, it is possible to reduce the error at the time of the AD conversion.

FIG. 12 illustrates an example circuit of the output circuit 22. The output circuit 22 is a source ground amplification circuit and includes the power source VDD, a current source 620, a transistor 621, a transistor 622, and the power source GND. The transistor 621 and the transistor 622 are, for example, N-type MOS transistors. The transistor 622 includes a gate connected to the output terminal op of the differential amplifier circuit 21, a drain including an output terminal out, and a source connected to the power source GND. The transistor 621 is a switch that controls a conductive state between the current source 620 and the drain of the transistor 622. An operation of the transistor 621 is controlled by a control signal P621 supplied to the gate of the transistor 621. Herein, a signal line 623 through which the control signal P621 is supplied may be provided commonly to the output circuits 22 of the other comparators 3. In the above-described case too, the fluctuation in the electric potential of the output terminal op of the differential amplifier circuit 21 may be propagated to the other comparators 3. Therefore, the signal line 623 through which the control signal of the output circuit 22 may be provided with a signal control unit.

Fifth Exemplary Embodiment

Figure 13:
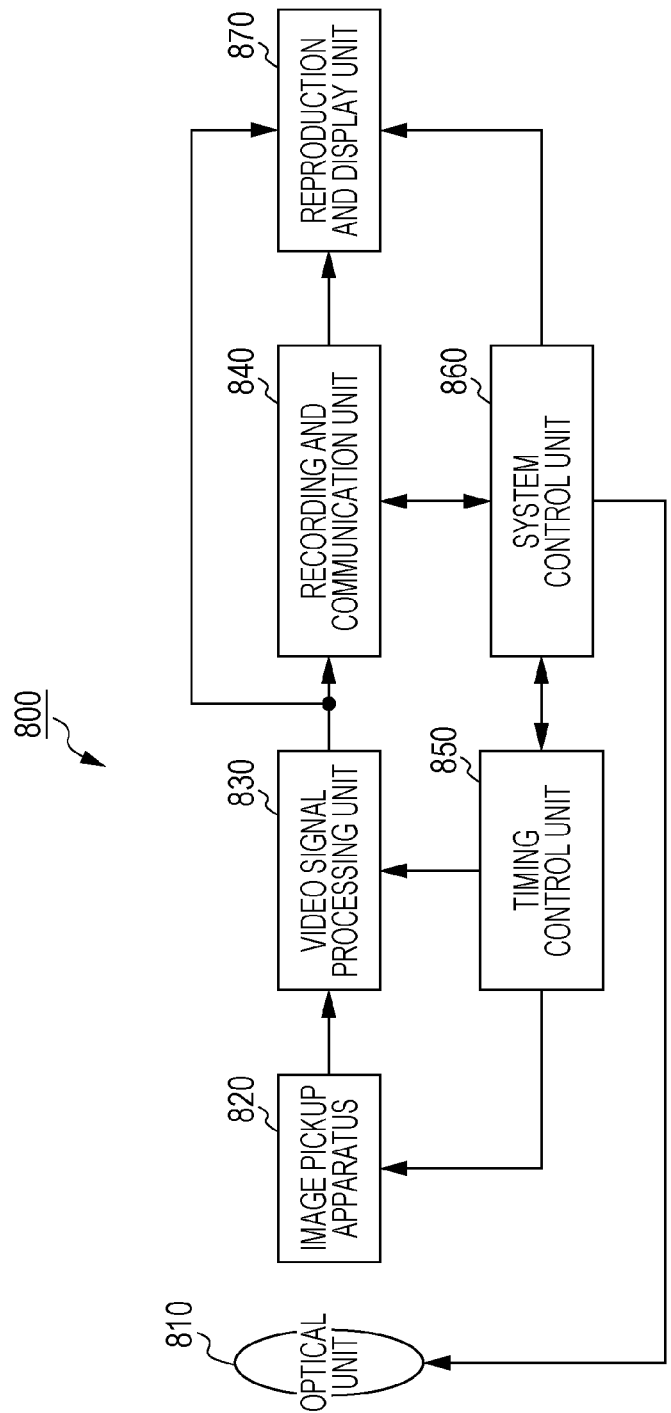
FIG. 13 is a block diagram for describing an image pickup system according to a fifth exemplary embodiment.

The present exemplary embodiment will be described with reference to FIG. 13. FIG. 13 is a block diagram illustrating a configuration example of an image pickup system. An image pickup system 800 includes not only an apparatus aiming mainly to perform an image pickup operation (for example, a camera or a camcorder) but also an apparatus secondarily provided with an image pickup function (for example, a personal computer or a mobile terminal). The image pickup system includes the image pickup apparatus exemplified as the above-described exemplary embodiment and a processing unit configured to process a signal output from the image pickup apparatus. The processing unit may include, for example, a processor configured to process the digital data output from the image pickup apparatus.

In FIG. 13, the image pickup system 800 includes, for example, an optical unit 810, an image pickup apparatus 820, a video signal processing unit 830, a recording and communication unit 840, a timing control unit 850, a system control unit 860, and a reproduction and display unit 870.

The optical unit 810 corresponding to an optical system such as a lens forms an image of an object by imaging light from the object on the pixel unit 1 where the plurality of pixels are two-dimensionally arranged in the image pickup apparatus 820. The image pickup apparatus 820 outputs a signal in accordance with the light imaged on the pixel unit 1 at a timing based on a signal from the timing control unit 850. The signal output from the image pickup apparatus 820 is input to the video signal processing unit 830 functioning as the processing unit, and the video signal processing unit 830 performs signal processing in accordance with a method determined by a program or the like. A signal obtained by the processing in the video signal processing unit 830 is transmitted to the recording and communication unit 840 as image data. The recording and communication unit 840 transmits a signal for forming an image to the reproduction and display unit 870, and the reproduction and display unit 870 reproduces or displays a video or a still image. The recording and communication unit 840 receives a signal from the video signal processing unit 830 to communicate with the system control unit 860 and also performs an operation of recording the signal for forming the image in a recording medium that is not illustrated in the drawing.

The system control unit 860 is configured to control the operation of the image pickup system in an overall manner. The system control unit 860 controls driving of the optical unit 810, the timing control unit 850, the recording and communication unit 840, and the reproduction and display unit 870. The system control unit 860 is provided, for example, with a storage apparatus that is not illustrated in the drawing corresponding to the recording medium, and a program or the like used for controlling the operation of the image pickup system is recorded in the recording medium. The system control unit 860 supplies, for example, a signal for switching a driving mode in accordance with an operation of a user to the image pickup system. Specific examples include changing of a row to be read or a row to be reset, changing of a field angle accompanied by electronic zooming, shifting of the field angle accompanied by an electronic image stabilizing function, and the like. The timing control unit 850 controls driving timings of the image pickup apparatus 820 and the video signal processing unit 830 on the basis of the control by the system control unit 860. In addition, the timing control unit 850 may function as a sensitivity setting unit configured to set an image pickup sensitivity of the image pickup apparatus 820.

It is possible to reduce the error at the time of the AD conversion by the image pickup apparatus according to the above-described exemplary embodiment. The configurations of the respective exemplary embodiments can be appropriately modified. In addition, the respective exemplary embodiments can be appropriately combined with each other.

With the image pickup apparatus according to the exemplary embodiment of the disclosure, it is possible to reduce the error caused at the time of the signal comparison.

While the disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2014-244334, filed Dec. 2, 2014, which is hereby incorporated by reference herein in its entirety.

What is claimed is:

1. An image pickup apparatus comprising:
a plurality of pixels arranged in rows and columns;
a plurality of comparators, each of the comparators being provided in association with at least one column of the plurality of pixels, and each of the comparators including a switch for controlling an operation;
a signal line which is provided commonly to the switches of the plurality of comparators and through which a control signal for controlling the switches of the plurality of comparators is supplied;
a control signal generation unit configured to supply the control signal to the signal line; and
a signal line control unit configured to control an electric potential of the signal line to be set as a fixed electric potential,
wherein the plurality of comparators are arranged between the control signal generation unit and the signal line control unit.

2. The image pickup apparatus according to claim 1, wherein each of the plurality of comparators includes a differential amplifier circuit including an input terminal and an output terminal, one end of the switch is connected to the output terminal, and the switch controls a connection between the input terminal and the output terminal in each of the plurality of comparators.

3. The image pickup apparatus according to claim 2, wherein other end of the switch is connected to the input terminal in each of the plurality of comparators.

4. The image pickup apparatus according to claim 2, wherein the signal line control unit does not operate during a period in which the switch is turned ON.

5. The image pickup apparatus according to claim 1,
wherein each of the plurality of comparators includes a differential amplifier circuit including a current source, and
wherein the switch controls ON and OFF of the current source.

6. The image pickup apparatus according to claim 1, wherein the signal line control unit includes a power supply that supplies a fixed electric potential and a second switch that controls a connection between the fixed electric potential and the signal line.

7. The image pickup apparatus according to claim 1,
wherein the signal line control unit includes a buffer including an input terminal and an output terminal,
wherein the signal line includes a first signal line and a second signal line, and
wherein the first signal line is connected to the input terminal of the buffer, and the second signal line is connected to the output terminal of the buffer.

8. The image pickup apparatus according to claim 1,
wherein the control signal generation unit is connected to one end of the signal line, and
wherein the signal line control unit is connected to other end of the signal line.

9. The image pickup apparatus according to claim 1, wherein at least one comparator among the plurality of comparators is arranged between the control signal generation unit and the signal line control unit.

10. The image pickup apparatus according to claim 1, further comprising:

a second signal line control unit configured to connect the signal line to the fixed electric potential in addition to the signal line control unit.

11. The image pickup apparatus according to claim 10, wherein at least one comparator among the plurality of comparators is arranged between the signal line control unit and the second signal line control unit.

12. The image pickup apparatus according to claim 1, wherein each of the plurality of comparators includes a differential amplifier circuit and an output circuit configured to output a signal from the differential amplifier circuit, and wherein each of the output circuits of the plurality of comparators includes a second output terminal and a second switch connected to the second output terminal, and wherein the image pickup apparatus further comprises:
a second signal line to which a second control signal for controlling the second switches of the plurality of comparators is supplied from the control signal generation unit and which is provided commonly to the second switches of the plurality of comparators and which supplies the second control signal to the second switches of the plurality of comparators; and
a third signal line control unit configured to connect the second signal line to the fixed electric potential.

13. The image pickup apparatus according to claim 1, wherein a signal from the pixel and a reference signal are input to each of the plurality of comparators, and an electric potential of the signal from the pixel is compared with an electric potential of the reference signal.

14. The image pickup apparatus according to claim 1, further comprising:
a plurality of storage units, each of the storage units holding a count value on the basis of a signal from each of the plurality of comparators,
wherein the plurality of comparators and the plurality of storage units constitute an AD converter.

15. The image pickup apparatus according to claim 14, wherein the AD converter is a ramp-type AD converter.

16. An image pickup system comprising:
an image pickup apparatus; and
a processing unit configured to process a signal from the image pickup apparatus,
the image pickup apparatus including
a plurality of pixels arranged in rows and columns,
a plurality of comparators, each of the comparators being provided in association with at least one column of the plurality of pixels, and each of the comparators including a switch for controlling an operation,
a signal line which is provided commonly to the switches of the plurality of comparators and through which a control signal for controlling the switches of the plurality of comparators is supplied,
a control signal generation unit configured to supply the control signal to the signal line, and
a signal line control unit configured to control an electric potential of the signal line to be set as a fixed electric potential,
wherein the plurality of comparators are arranged between the control signal generation unit and the signal line control unit.

* * * * *